(12) United States Patent
Trapp

(10) Patent No.: US 7,153,779 B2
(45) Date of Patent: Dec. 26, 2006

(54) METHOD TO ELIMINATE STRIATIONS AND SURFACE ROUGHNESS CAUSED BY DRY ETCH

(75) Inventor: Shane J Trapp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 268 days.

(21) Appl. No.: 10/382,019

(22) Filed: Mar. 5, 2003

(65) Prior Publication Data

US 2003/0162395 A1    Aug. 28, 2003

Related U.S. Application Data

(63) Continuation of application No. 09/652,835, filed on Aug. 31, 2000, now Pat. No. 6,569,774.

(51) Int. Cl.
*H01L 21/302*    (2006.01)

(52) U.S. Cl. ............... 438/706; 438/639; 438/714; 216/58

(58) Field of Classification Search ........... 438/706, 438/710, 712, 720, 637, 639, 640, 714; 216/57, 216/58, 67
See application file for complete search history.

(56) References Cited

U.S. PATENT DOCUMENTS

| 4,465,552 A | 8/1984 | Bobbio et al. ............ 156/643 |
|---|---|---|
| 4,615,764 A | 10/1986 | Bobbio et al. ............ 156/643 |
| 4,711,698 A | 12/1987 | Douglas ................... 156/643 |
| 4,734,157 A | 3/1988 | Carbaugh et al. ........ 156/643 |
| 5,176,790 A * | 1/1993 | Arleo et al. ............. 438/715 |
| 5,254,213 A | 10/1993 | Tamaki ................... 156/655 |
| 5,269,879 A | 12/1993 | Rhoades et al. .......... 156/643 |
| 5,468,339 A | 11/1995 | Gupta et al. ................ 216/67 |
| 5,468,342 A | 11/1995 | Nulty et al. ........... 156/643.1 |
| 5,562,801 A * | 10/1996 | Nulty ..................... 438/695 |
| 5,637,189 A * | 6/1997 | Peeters et al. ........... 438/466 |
| 5,719,089 A * | 2/1998 | Cherng et al. ........... 438/637 |
| 5,783,495 A | 7/1998 | Li et al. .................. 438/738 |
| 5,877,032 A * | 3/1999 | Guinn et al. ................ 438/9 |
| 5,895,740 A * | 4/1999 | Chien et al. ............. 430/313 |
| 5,935,877 A * | 8/1999 | Autryve ................... 438/743 |
| 6,063,712 A | 5/2000 | Gilton et al. ............. 438/756 |
| 6,074,957 A | 6/2000 | Donohoe et al. ......... 438/723 |
| 6,204,193 B1 | 3/2001 | Jozaki .................... 438/723 |
| 6,217,786 B1 * | 4/2001 | Hills et al. ................ 216/79 |
| 6,617,253 B1 * | 9/2003 | Chu et al. ................ 438/702 |

* cited by examiner

*Primary Examiner*—Lan Vinh
(74) *Attorney, Agent, or Firm*—Whyte Hirschboeck Dudek SC

(57) ABSTRACT

A plasma etch process for forming a high aspect ratio contact opening through a silicon oxide layer is disclosed. The silicon oxide layer is plasma etched using etch gases that include at least one organic fluorocarbon gas. At least one etch gas is used that includes one or more nitrogen-comprising gases to deposit a surface polymeric material during the etching for maintaining a masking layer over the silicon oxide layer. The method of the invention achieves a complete and anistropic etching of a contact opening having a high aspect ratio and the desired dimensions.

63 Claims, 4 Drawing Sheets

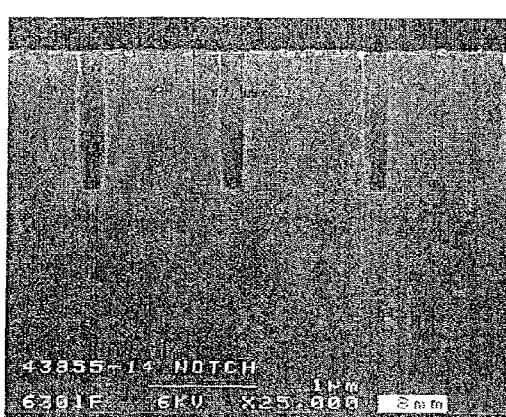 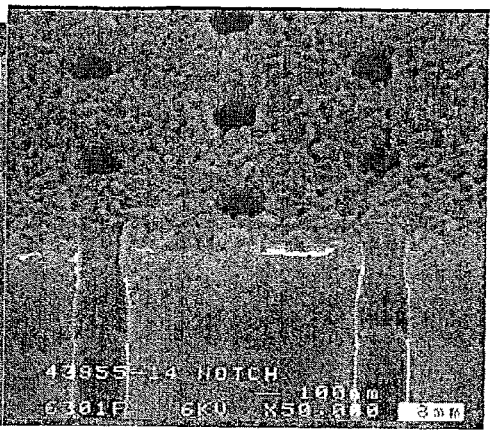

FIG. 12a          FIG. 12b

X-section and oblique top downs of hydroflourocarbon and flourocarbon etch. Note surface roughness of the resist on the right. This roughness has been shown to cause striations at the tops of high aspect ratio etch contacts.

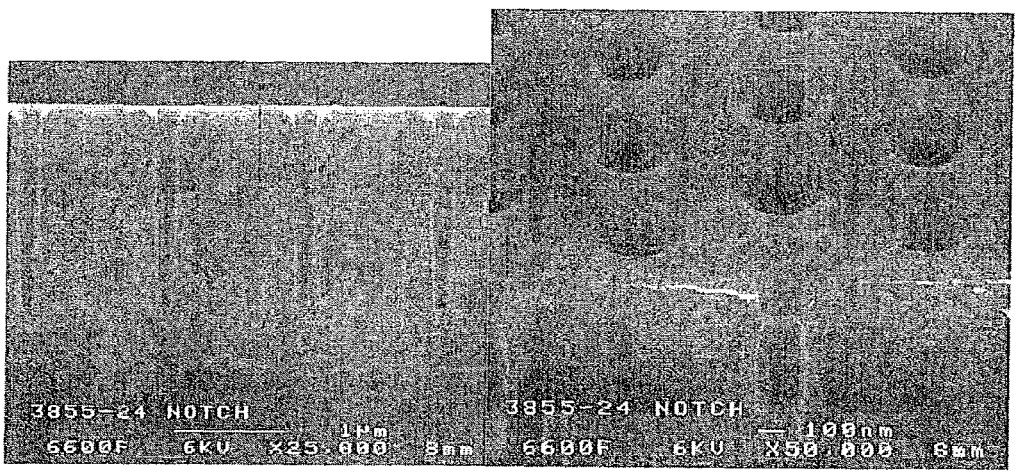

FIG. 12c          FIG. 12d

Same etch chemistry as above but with 16sccm of NH3 added to the feed gas. Note the smoothness of the surface of the resist in the picture on the right. The wafer also has approximately 2000A more remaining resist as compared to the wafer above that did not have NH3 added to the etch chemistry. This wafer also has etched 4000A more bpsg than the wafer above.

METHOD TO ELIMINATE STRIATIONS AND SURFACE ROUGHNESS CAUSED BY DRY ETCH

This application is a Continuation of patent application Ser. No. 09/652,835 filed on Aug. 31, 2000 now U.S. Pat. 6,569,774.

FIELD OF THE INVENTION

The present invention relates to the field of semiconductor device fabrication, and more particularly to improved methods for etching high aspect ratio contact openings in oxide layers.

BACKGROUND OF THE INVENTION

In the fabrication of semiconductor devices, numerous conductive device regions and layers are formed in or on a semiconductor substrate. The conductive regions and layers of the device are isolated from one another by a dielectric or insulating layer, for example, silicon dioxide or a doped oxide such as phosphosilicate glass (PSG) and borophosphosilicate glass (BPSG). These dielectric layers typically overlay a silicon-comprising surface such as single crystal silicon, epitaxial silicon, polysilicon, or silicides such as titanium silicide.

At several stages during wafer fabrication, it is necessary to form contact openings through insulative material to establish electrical communication with the integrated circuitry. Such contact openings, when filled with a conducting material such as a metal or polysilicon, electrically connect devices with the integrated circuitry. To ensure formation of desired dimensions and profile for contact openings, the etchant must be highly selective to promote removal of the insulation layer and not the underlying layer.

Contact openings with high aspect ratios, i.e., a high height-to-width ratio, are formed to be fairly narrow, typically with vertical sidewalls to ensure that a sufficiently large contact area is provided at the bottom of the contact opening for conductive material that is subsequently formed in the opening. To form the openings, a masking layer such as a photoresist is formed over the insulative layer, i.e., silicon oxide layer, and is subsequently patterned to define the contact openings. The contact opening is etched using an etch that is highly selective relative to masking layer. Conventional processes used to form a contact opening involve etching through the insulative layer by exposure to a plasma formed in a plasma reactor. Reactive ion etching (RIE) and plasma etching (PE) are common dry-etch plasma methods used to open contact openings anisotropically through a dielectric.

A fluorocarbon plasma is typically used to etch silicon dioxide. Such a plasma typically includes one or more fluorocarbons as the primary active constituents, for example $CF_4$, $CHF_3$, and $C_3F_8$, $CH_2F_2$, $CH_3F$, $C_2F_6$, $C_4F_6$, $C_nF_{n+4}$, and mixtures thereof. The fluorinated gas dissociates and reacts with the silicon oxide to form volatile silicon difluoride ($SiF_2$) or silicon tetrafluoride ($SiF_4$) and carbon monoxide or carbon dioxide.

Although the plasma etch rate of the oxide is generally faster than the resist erosion rate, when dry etching an opening having a high aspect ratio, the etch chemistry causes the resist layer to gradually erode away, often before the desired depth of the opening is achieved. Another problem is related to faceting or chaffering of the photoresist mask at the edge of the opening, caused by ion bombardment. This can wear away the underlying oxide resulting in surface roughness and striations in the etch features, and the loss of critical dimensions of the opening being etched. In an array such as a memory cell, contacts are positioned in close proximity to each other, and the erosion and localized breakdown of the photoresist can result in the development of notches and other blemishes in the surface of the contact, which can extend to and short an adjacent contact.

The plasma etching processes generates very reactive ionized species, atomic fluorine, and $C_xF_y$, radicals that combine to form polymeric residues. A drawback with plasma etching and RIE of silicon oxide using some fluorinated etch gases is the buildup of carbon-fluorine based polymer material on the sidewalls of vias and other openings that can deposit during the etch. FIG. 1 illustrates a wafer fragment 10, a contact opening 12 etched through an opening in a mask 14 downwardly through a silicon oxide layer 16 deposited on a substrate 18, and the effect of the buildup of polymeric residues 20 on the sidewalls 22 and the bottom surface 24 of the contact opening 12 formed during a typical prior art etch process.

The continuous buildup of polymeric etch residues on sidewalls 22 of the oxide opening 12 tends to constrict the opening, inhibiting the etch and resulting in the profile of the sidewalls becoming tapered, as depicted in FIG. 1. Polymer material can also build up in the bottom 24 of the opening 12. Since an anistropic etch of the oxide layer 16 relies on ionic bombardment of the bottom 24 of the opening being etched, if too much polymeric layer 20 deposits on the bottom surface 24 of the opening during etching, etching of the contact opening will cease if the layer 24 is not removed.

Therefore, a need exists for a method of etching silicon oxide layers to provide high aspect ratio openings that overcomes these problems. It would be desirable to provide an etching process for the formation of deep contact openings through an oxide layer that inhibits or regulates the deposition of polymeric etch residues on the sidewalls of the openings and improves resist selectivity and eliminates striations and notching.

SUMMARY OF THE INVENTION

The invention provides an improved process for plasma etching of a silicon oxide layer to form a via or other contact opening while controlling the deposition of polymeric residues on the surface of a mask layer and the sidewalls and bottom surface of the contact opening. In particular, the invention improves resist selectivity and reduces striations by the addition of nitrogen-comprising gases such as $NH_3$ to fluorocarbon ($C_xF_y$) and fluorohydrocarbon ($C_xF_yH_z$) etch chemistries.

The etching is performed by exposing the silicon oxide layer through a mask opening to an etch gas in an ionized state in a reaction chamber of a plasma-generating device. The etch gas includes one or more organic fluorine-comprising gases such as $CF_4$, $CHF_3$, $CH_2F_2$, among others, and can include one or more nitrogen-comprising gases. Suitable nitrogen-comprising gases are those that do not substantially etch the resist layer and/or deposit or build-up polymer on the mask layer. Exemplary nitrogen-comprising gases include $N_2O$, $NH_3$, $N_2H_4$, and $RNH_2$ where R is a $C_1$–$C_3$ hydrocarbon or fluorohydrocarbon, among others. The etch gas can optionally include one or more inert carrier gases such as argon or helium. The etching is preferably performed by reactive ion etching or plasma etching. The etch gas can be exposed to a microwave electric field and/or a magnetic field during the etching step.

In one embodiment of the invention, the method involves etching the layer of silicon oxide to provide an opening extending therethrough by exposing the silicon oxide layer through a mask opening to a first etch gas and then a second etch gas, in an ionized state in a reaction chamber of a plasma generating device. A first etching is performed by exposing the silicon oxide layer to etch a contact opening through the silicon oxide layer, preferably to a depth of at least about 0.5 micron, and an aspect ratio of at least about 2:1. The first etch gas includes at least one organic fluorocarbon and, optionally, one or more nitrogen-comprising gases in a minor amount such that there is essentially little or no polymeric material formed on the mask layer and the silicon oxide layers during the etching step.

A second etching is then performed by exposing the silicon oxide layer to a second etch gas to increase the opening downwardly through the silicon oxide layer while a polymeric material is formed on the mask layer during the etching step. The second etch gas includes at least one organic fluorocarbon and an effective amount of at least one nitrogen-comprising gas to reduce the resist etch rate and/or provide formation of polymeric material on the mask layer during the etching step. The second etch gas can be provided as a separate gas or by increasing the amount of the nitrogen-comprising gas of the first etch gas to reduce the etch rate of the resist and/or deposit polymeric material on the mask during the etching step to inhibit erosion of the mask layer. Upon depositing a layer of the polymeric material that protects the photomask layer opening, the silicon oxide layer can be further etched to increase the depth of the opening by exposing the oxide layer to the first etch gas, or by decreasing the amount of the nitrogen-comprising gas in the second etch gas to a level whereby formation of polymeric material on the mask is substantially suppressed during the etching step.

In another embodiment of the invention, the method involves etching a contact opening through a silicon oxide layer by exposing the silicon oxide layer to a first etch gas to partially etch the opening while a polymeric material is formed on the surface of the mask, and then to a second etch gas to further extend the opening downward while suppressing deposition of the polymeric material. The first etch gas includes at least one organic fluorocarbon and an effective amount of at least one nitrogen-comprising gas to reduce the etch rate of the resist and/or provide formation of polymeric material on the mask layer during the etching step to help maintain the thickness of the mask layer on the silicon oxide layer.

Upon depositing a layer of the polymeric material that protects the photoresist mask or inhibits etching of the photoresist mask, a second etching is performed to extend the opening downwardly by decreasing the amount of the nitrogen-comprising gas in the etch gas or applying a second etch gas that includes at least one organic fluorocarbon and, optionally, a minor amount of one or more nitrogen-comprising gases, whereby formation of polymeric material on the mask is substantially suppressed during the etching step. Upon reducing the layer of polymeric material whereby the contact opening is unconstricted, the silicon oxide layer can be further etched to increase the depth of the opening by exposing the oxide layer to the first etch gas, or by increasing the amount of the nitrogen-comprising gas to reduce the etch rate of the resist and/or deposit polymeric material on the mask during the etching step to inhibit erosion of the mask layer.

It was found that the addition of a nitrogen-comprising gas such as $NH_3$ to the fluorocarbon etch gas helps maintain the smoothness of the surface of the resist layer to eliminate striations in the etch features, helps eliminate faceting and erosion of the mask and increases the resist selectivity, i.e., decreases the photoresist etch rate with respect to the oxide etch rate. Advantageously, the present invention provides a method for achieving an anistropic etch of an oxide layer to provide a contact opening having a high aspect ratio of at least about 5:1 by using and controlling the amount of polymeric material that forms on the mask layer from the etch gases to maintain the integrity of the mask throughout the etch process to help control the resolution or dimension of the diameter of the contact opening.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The present invention provides a method for etching of silicon oxide such as silicon dioxide ($SiO_2$), BPSG, and PSG, among others, to provide a contact opening such as a via having a high aspect ratio extending through the silicon oxide layer. The contact opening is formed by etching away an exposed area of the silicon oxide layer through the opening in a mask layer so that the sidewalls are substantially vertical.

In accordance with the invention, the formation of polymeric residues on the sidewalls of vias and other contact openings formed in a silicon oxide layer is inhibited or controlled by the use of etch gases comprising at least one organic fluorine-comprising gas and a limited amount of one or more nitrogen-comprising gases. The amount of the nitrogen-comprising gas in the etch gas can be varied from as little as zero up to about 40% by volume of the reactant gas volume, excluding inert gases such as argon (Ar) and helium (He), preferably from about zero to about 20% by volume.

Etching of the silicon dioxide layer is preferably by plasma etch, which is generally conducted within an etch chamber of a plasma generating device. The plasma etch technique can include the use of reactive ion etching (RIE), plasma etching (PE), or other type of etching technique, for example, electron cyclotron resonance (ECR), MIE, microwave plasma source, TCP plasma capacitively coupled plasma reactor, magnetically enhanced cyclotron resonance (MERIE), among others, as known in the art. Various etch parameters such as the gas mixture, temperature, RF power, pressure, and gas flow rate, among others, can be varied to achieve the desired etch rate and etch characteristics of the plasma system, as described herein.

Figure 1:
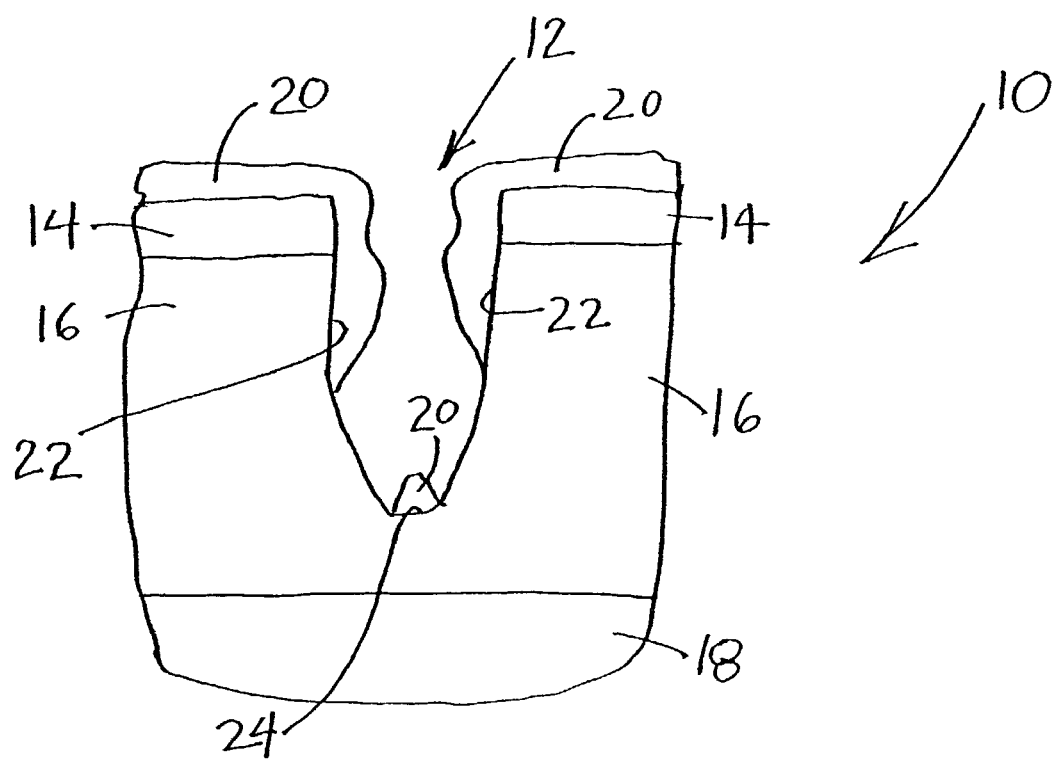
FIG. 1 is a diagrammatic side sectional view of a semiconductor wafer fragment having a contact opening that has been etched in a typical prior art etch process.
Figure 2:
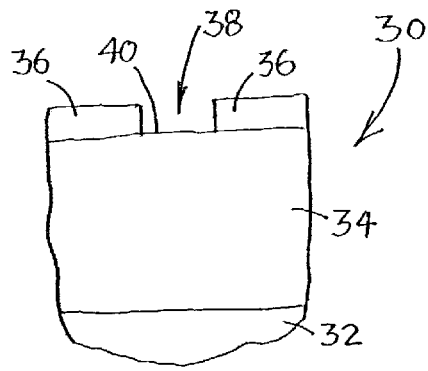
FIG. 2 is a diagrammatic sectional view of a semiconductor wafer fragment in process according to one embodiment of the method of the present invention.

FIGS. 2–6 depict a wafer fragment having a contact opening formed by a first embodiment of the invention. Referring to FIG. 2, a cross-section of a semiconductor wafer fragment, designated generally as 30, is shown in an etch process step. The wafer fragment 30 comprises a substrate 32, and a silicon oxide layer 34 formed on the substrate 32 to a selected thickness to be etched, for example, a thickness of about 2 microns. The substrate 32 is a support layer that may or may not comprise a semiconductor material such as silicon, and can include at least one or more semiconductor layers or other layer. Exemplary silicon oxides include silicon dioxide, tetraethylorthosilicate (TEOS), and borophosphosilicate glass (BPSG), in a single layer or multiple layers. A mask layer 36, for example, photoresist, is formed over the silicon oxide layer 34 and, as depicted, is subsequently patterned and etched to define a mask opening 38 that exposes a portion 40 of the silicon oxide layer 34. The mask layer 36 can be deposited, patterned and developed to provide a desired contact pattern using conventional photolithographic techniques as known in the art.

Figure 3:
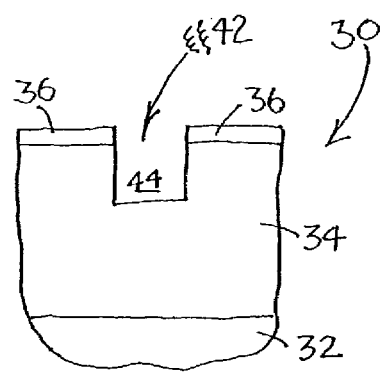
FIG. 3 is a view of the wafer fragment of FIG. 2 at a processing step subsequent to that of FIG. 2.

After the wafer or other substrate 30 is introduced into the reaction chamber of a plasma generating device such as an RIE apparatus (not shown), the etch gases are introduced into the etching chamber of the apparatus. According to one embodiment of the method of the present invention, a first etching of the silicon oxide layer, as shown in FIG. 3, is by the use of a first etch gas 42 that comprises at least one organic fluorocarbon and, optionally, a minor amount of one or more nitrogen-comprising gases to suppress formation of any polymeric material on the mask during the etching step. Preferably, the first etching is continued to form a contact opening 44 in the silicon oxide layer 34 to a depth at which substantially no polymeric residues from an etch gas can diffuse into the contact opening and deposit on the bottom surface of the opening to stop the etch, preferably to a depth of at least about 0.5 micron, and an aspect ratio of at least about 2:1.

Figure 4:
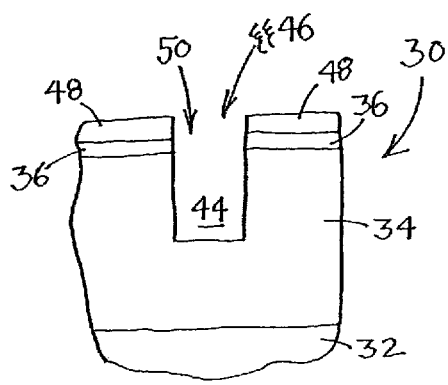
FIG. 4 is a view of the wafer fragment of FIG. 2 at a processing step subsequent to that of FIG. 3.

As the first etching progresses, the mask layer 36 can thin or start to erode (FIG. 3). At that point, it is desirable to continue the etching with a second etch gas 46 comprising at least one organic fluorocarbon and one or more nitrogen-comprising gases in an amount effective to inhibit etching of the resist and/or deposit a polymeric material 48 on the surface of the mask 36, as shown in FIG. 4. The second etch gas 46 can be provided as a separate gas or by increasing the amount of the nitrogen-comprising gas of the first etch gas to an effective level to deposit polymeric material on the mask during the second etching step. The polymeric buildup on the mask 36 helps to inhibit its erosion and maintain a masking layer to facilitate continuing an anistropic etch to extend the contact opening 44 downwardly into the silicon oxide layer 34.

Figure 5:
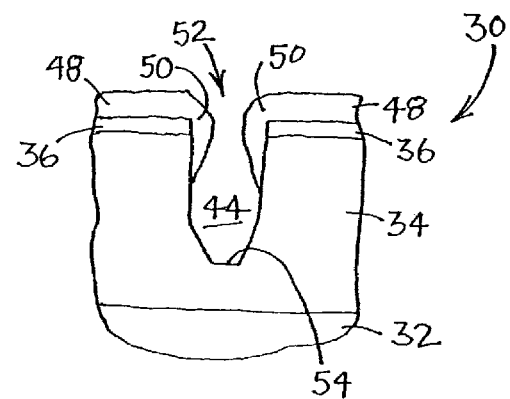
FIG. 5 is a view of the wafer fragment of FIG. 2 at a processing step subsequent to that of FIG. 4.
Figure 6:
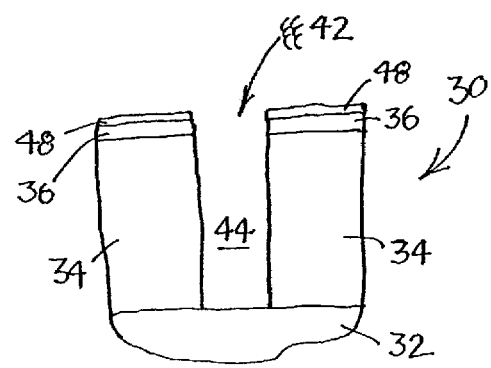
FIG. 6 is a view of the wafer fragment of FIG. 2 at a processing step subsequent to that of FIG. 5.

As the second etching progresses, a buildup of polymeric material from the use of the second etch gas can eventually produce a breadloaf-type structure 50, as depicted in FIG. 5, that constricts the opening 52 of the contact opening 44 and limits the passage of the etch gas to the bottom surface 54 of the contact opening. This results in a tapering of the sidewalls of the contact opening away from a vertical orientation. In that case, etching can continue, as shown in FIG. 6, using the first etch gas 42 comprising the fluorocarbon gas and zero to a minimal amount of the nitrogen-comprising gas, or by decreasing the amount of the nitrogen-comprising gas in the etch gas 46 to a level whereby formation of polymeric material on the mask is substantially suppressed during the etching step, as provided by the first etching step using etch gas 42. Thus, the first and second etching steps can be repeated until the desired depth and aspect ratio of the contact opening is attained.

In a preferred method, the silicon oxide layer 34 is first etched through a mask opening 38 to form an opening 44 in the silicon oxide layer, using a first etch gas 42 that includes one or more organic fluorocarbons and a minimal amount of one or more nitrogen-comprising gases, preferably about zero to about 2% by volume, based on the total volume of the first etch gas, excluding inert gases such as Ar and He, whereby little or no polymeric material is formed on the mask during the etching step (FIGS. 2–3). After the first etching, preferably when the depth of the contact opening is at least about 0.5 micron, and the aspect ratio is at least about 2:1, a second etching into the silicon oxide layer through the mask opening is performed using a second etch gas 48 that includes at least one organic fluorocarbon and a nitrogen-comprising gas in an amount effective to inhibit etching of the resist, and/or deposit polymeric material 48 on the mask 36 to inhibit erosion of the mask layer such that the second etching can be used to extend the contact opening 44 downwardly into the oxide layer (FIG. 4). The second etch gas 46 can include up to about 40% by volume of the nitrogen-comprising gas, and preferably about 3% to about 40% by volume, more preferably about 3% to about 20% by volume, based on the reactant species volume of the second etch gas, excluding inert gases, i.e. Ar and He.

Figure 7:
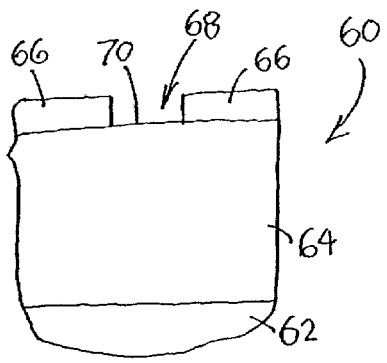
FIG. 7 is a diagrammatic sectional view of a semiconductor wafer fragment in process according to a second embodiment of the method of the present invention.

FIGS. 7–11 depict formation of a contact opening in a wafer according to a second embodiment of the method of the invention. Depicted in FIG. 7 is a cross-section of a semiconductor wafer fragment 60 similar to that shown in FIG. 2, which includes a substrate 62, and a silicon oxide layer 64, and a mask layer 66 having a mask opening 68 that exposes a portion 70 of the silicon oxide layer 64. Similar to the first method of the invention, a contact opening can be etched through a silicon oxide layer using a plasma generating device, as known and used in the art.

Figure 8:
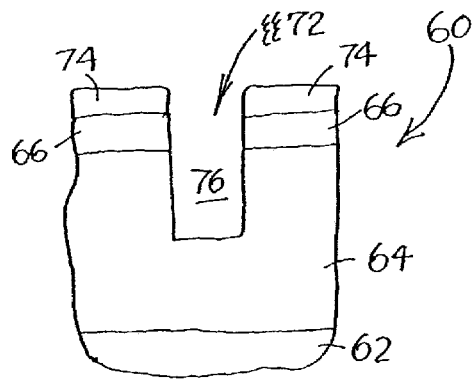
FIG. 8 is a view of the wafer fragment of FIG. 7 at a processing step subsequent to that of FIG. 7.

Referring to FIG. 8, according to a second embodiment of the method of the present invention, a first etch gas 72 comprising a gas mixture of one or more organic fluorocarbons and up to about 40% by volume of a nitrogen-comprising gas, based on the total volume of the first etch gas, excluding inert gases, is flowed into the reaction chamber of the plasma generating device (not shown). The amount of the nitrogen-comprising gas component that is included in the first etch gas 72 is effective to deposit a polymeric material 74 on the surface of the mask 66 during the etch and/or inhibit etching of the resist. With the first etch gas 72, a contact opening 76 is plasma etched through the silicon oxide layer 64 to a desired depth, while a sufficient amount of the polymeric material 74 is formed on the mask layer to inhibit erosion of the mask and/or etching of the resist is substantially reduced.

Figure 9:
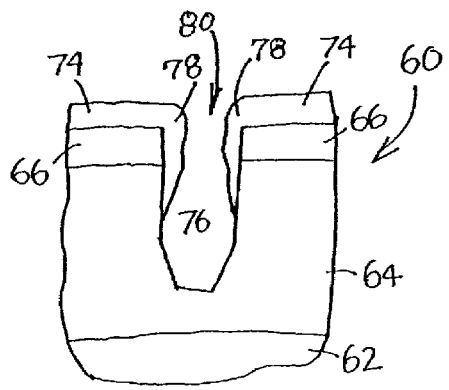
FIG. 9 is a view of the wafer fragment of FIG. 7 at a processing step subsequent to that of FIG. 8.
Figure 10:
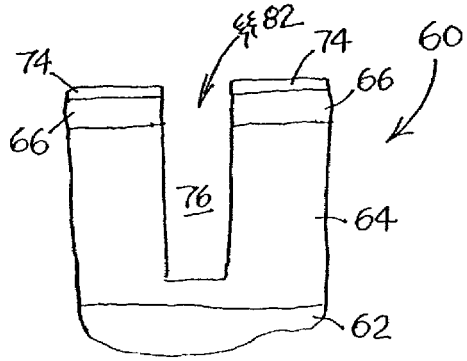
FIG. 10 is a view of the wafer fragment of FIG. 7 at a processing step subsequent to that of FIG. 9.

As depicted in FIG. 9, the polymeric material 74 can gradually build up on the mask 66 resulting in breadloafing 78, constriction of the opening 80 of the contact opening, and a tapered etch. Referring now to FIG. 10, a second etching of the silicon oxide layer 64 is commenced to continue the etch of the contact opening 76 downwardly while reducing or suppressing the build up of the polymeric material 74. A second etching of the oxide layer 64 is performed by exposing the wafer 60 to a second etch gas 82 comprising one or more organic fluorocarbons and, optionally, a minor amount of up to about 2% by volume of one or more nitrogen-comprising gases, based on the total volume of the second etch gas, excluding inert gases such as Ar and He, whereby substantially no polymeric material is formed on the mask during the etching step. The second etch gas 82 can be provided as a separate gas or by decreasing the amount of the nitrogen-comprising gas in the first etch gas 72 to an effective level where formation of polymeric material is substantially suppressed during the etch step.

Figure 11:
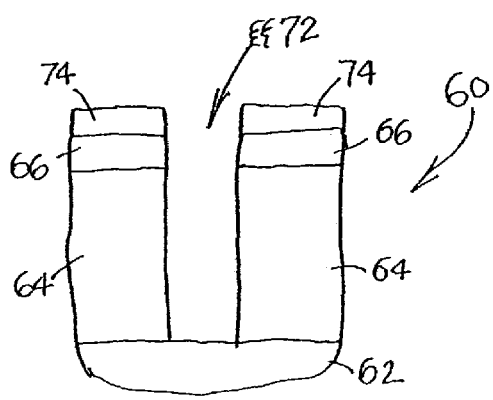
FIG. 11 is a view of the wafer fragment of FIG. 7 at a processing step subsequent to that of FIG. 10.
Figure 1:
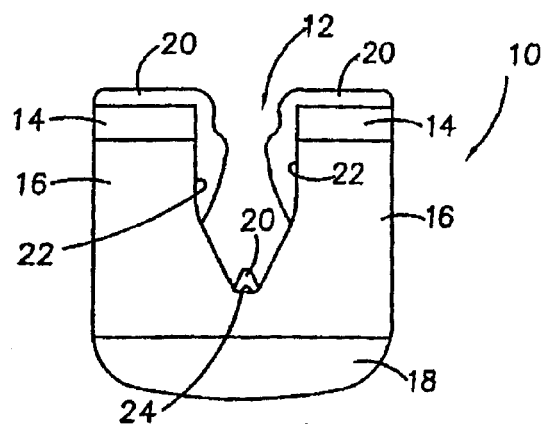
Figure 2:
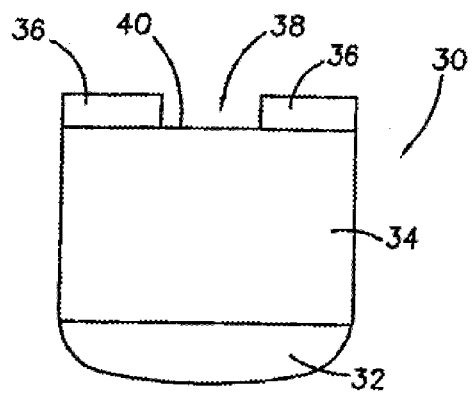
Figure 3:
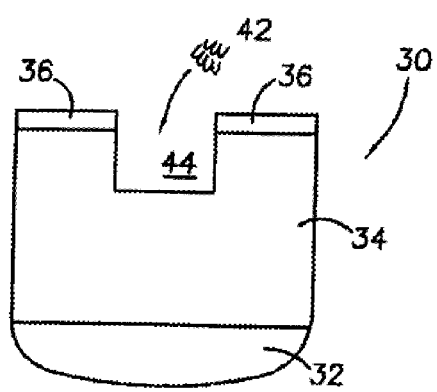
Figure 4:
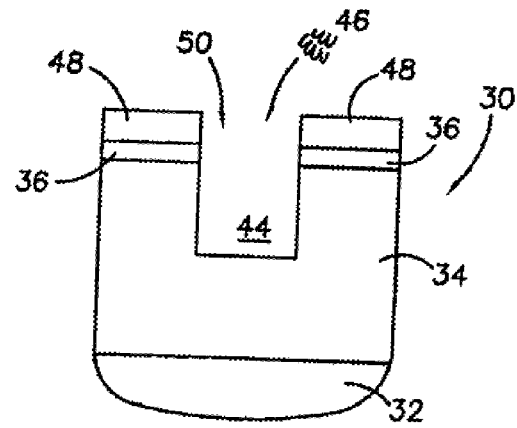
Figure 5:
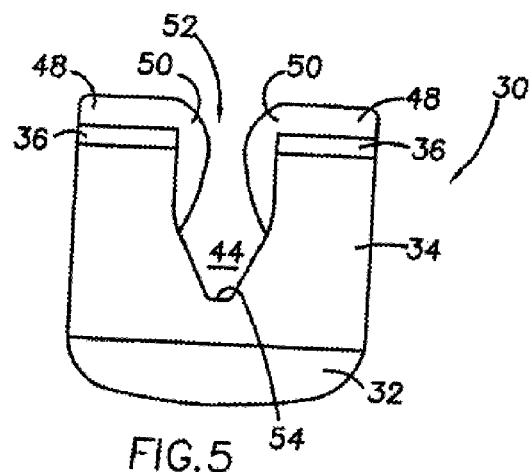
Figure 6:
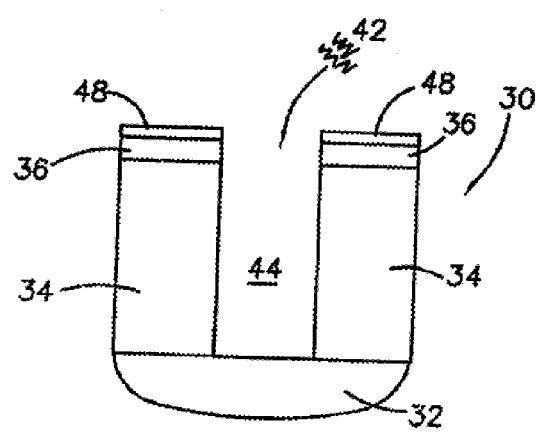
Figure 7:
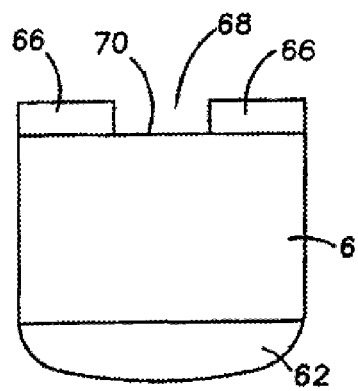
Figure 8:
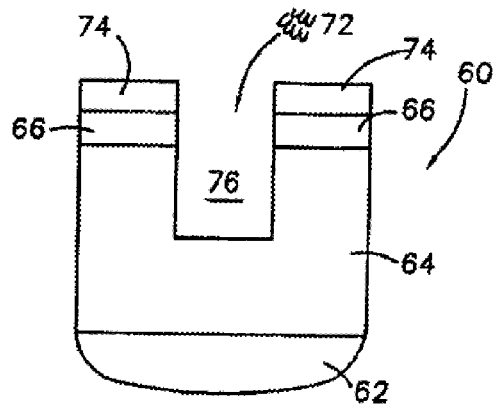
Figure 9:
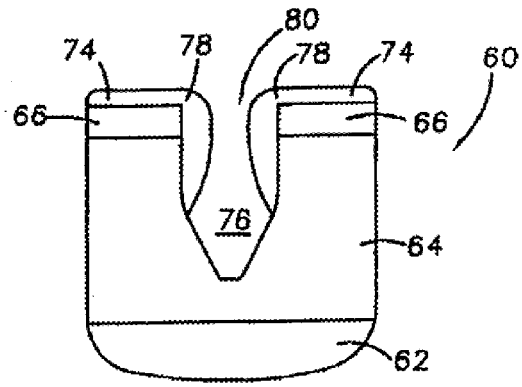
Figure 10:
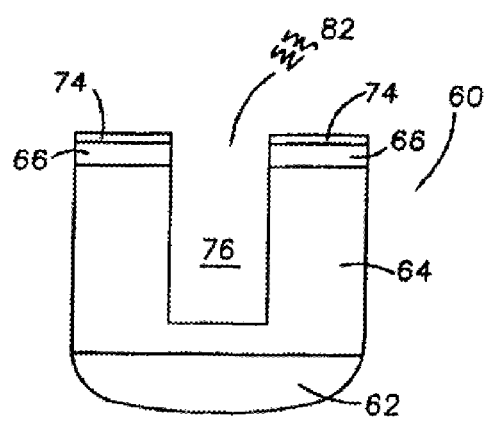
Figure 11:
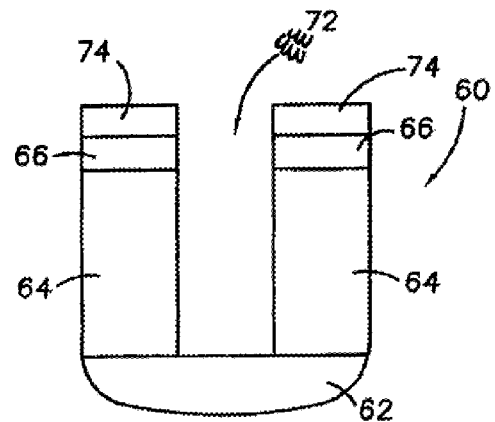

As the second etching progresses, the polymeric layer 74 over the mask 66 can decrease (FIG. 10) to where it is desirable to build up a protective layer over the mask 66 to preclude its erosion so that the etch of the contact opening 76 can continue to the desired depth. As depicted in FIG. 11, etching can be continued by repeating the first etching using the first etch gas 72 comprising the fluorocarbon gas component and an effective amount of the nitrogen-comprising gas up to about 40% by volume excluding inert gases, or by increasing the amount of the nitrogen-comprising gas in the second etch gas 82 to a level whereby additional polymeric material 74 is deposited on the surface of the mask 66 and/or etching of the resist is inhibited, as provided in the first etching step using etch gas 72. Accordingly, by repeating the first and second etching steps, a desired depth and aspect ratio of the contact opening can be achieved.

In a preferred method, the silicon oxide layer 64 is first etched through a mask opening 68 to form a contact opening 76 in the silicon oxide layer 64, using a first etch gas 72 that includes at least one organic fluorocarbon and a nitrogen-comprising gas in an amount effective to substantially reduce etching of the resist and/or deposit polymeric material 74 on the mask 66 to provide a protective overlayer for inhibiting erosion of the mask layer, while etching the contact opening 76 downwardly into the silicon oxide layer 64 (FIGS. 7–8 and 9). The first etch gas 72 can include up to about 40% by volume of the nitrogen-comprising gas, and preferably about 3% to about 40% by volume, more preferably about 3% to about 20% by volume, based on the reactant volume of the first etch gas, excluding inert gases. A second etching of the silicon oxide layer 64 is then performed using a second etch gas 82 that includes at least one organic fluorocarbon and, optionally, a minimal amount of a nitrogen-comprising gas of about zero (0) to about 2% by volume, based on the total volume of the first etch gas, excluding inert gases, whereby there is essentially no polymer buildup during the etching step (FIG. 10).

In the practice of the present invention, the fluorocarbon gas component of the etch gas can comprise a single organic fluorocarbon gas used alone, or a mixture of two or more organic fluorocarbon gases. The organic fluorocarbon gas can comprise one or more 1–2 carbon fluorocarbon gases having the general formula $C_xH_yF_z$ wherein x is 1 to 2, y is 0 to 3, and z is 2x−y+2. Examples of such 1–2 carbon fluorocarbon gases include $CF_4$, $CHF_3$, $CH_2F_2$, $C_2F_6$, among others.

The organic fluorocarbon gas can also comprise one or more higher molecular weight, 3–6 carbon fluorinated hydrocarbons having the general formula $C_xH_yF_z$ wherein x is 3 to 6, y is 0 to 3, and z is 2x−y when the fluorinated hydrocarbon is cyclic, and z is 2x−y+2 when the fluorinated hydrocarbon is noncyclic. Examples of cyclic 3–6 carbon fluorocarbon compounds which may be included in the foregoing formula include $CH_3F$, $C_3H_3F_3$, $CH_2F_4$, $C_3HF_5$, $C_3F_6$, $C_4H_3F_6$, $C_4H_2F_6$, $C_4HF_7$, $C_4F_6$, $C_4F_8$, $C_5H_3F_7$, $C_5H_2F_8$, $C_5HF_9$, $C_5F_{10}$, $C_6H_3F_9$, $C_6H_2F_{10}$, $C_4F_{11}$, and $C_6F_{12}$, among others. Examples of noncyclic 3–6 carbon fluorinated hydrocarbons compounds include, for example, $C_3H_3F_5$, $C_3H_2F_6$, $C_3HF_7$, $C_3F_8$, $C_4H_3F_7$, $C_4H_2F_8$, $C_4HF_9$, $C_4F_{10}$, $C_5H_3F_9$, $C_5H_2F_{10}$, $C_5HF_{11}$, $C_5F_{12}$, $C_6H_3F_{11}$, $C_6H_2F_{12}$, $C_4HF_3$, and $C_6F_{14}$, among others. Preferably, the organic fluorcarbon gas comprises $CF_4$, $CHF_3$, $CH_2F_2$, or a mixture thereof.

The nitrogen-comprising gas can comprise $N_2O$, $NH_3$, $N_2H_4$, $RNH_2$ where R is a $C_1$–$C_3$ hydrocarbon or fluorohydrocarbon, and mixtures thereof, with $NH_3$ preferred. A controlled amount of one or more nitrogen-comprising gases is added to the etch gas mixture to facilitate etching of a contact opening having a high aspect ratio. Up to about 40% by volume of a nitrogen-comprising gas can be included in a fluorine-comprising etch gas to inhibit etching of the resist and/or provide formation of a polymeric surface layer on the mask, preferably in a range from about 3% to about 40% by volume, more preferably about 3% to about 20% by volume, based on the reactant volume of the etch gas, excluding inert carrier gases.

The flow rates of the various constitutent gases of the etch gases can be adjusted as needed to provide suitable etching according to the methods of the invention, and to accommodate the size of the etching chamber and the wafer being etched. Typically, for an etch gas comprising up to about 40% by volume nitrogen-comprising gas, the flow of the nitrogen gas component into a 13-liter etching chamber will range from about 2 to about 30 sccm, and the flow of the fluorine-comprising gas component will range from about 10 to about 200 sccm. For an etch gas comprising zero (0) to about 2% by volume of a nitrogen-comprising gas, the flow of the nitrogen gas component into a 13-liter etching chamber will range from about 0 to about 6 sccm, and the flow of the fluorine-comprising gas component will range from about 10 to about 200 sccm.

Optionally, the etch gas may further include one or more inert gases such as helium or argon, up to about 90% by volume of the total mixture of gases, more preferably about 30% to about 50% by volume. Such inert gases may be flowed into the etch chamber at a rate of 0 to about 500 sccm.

The power level of the plasma associated with the etch chamber and the pressure in the etch chamber should be sufficient to maintain the etching process. For example, to etch an eight-inch wafer using an RIE or MERIE type plasma generator with a 13-liter reaction chamber, the power level will typically range from about 600 watts to about 700 watts, for a desired etch rate of about 5000 angstroms per minute. The pressure will generally range from about 20 mTorr to about 100 mTorr, and is preferably maintained at less than about 50 mTorr.

EXAMPLE

A wafer having a 20,000 angstroms layer of BPSG masked with a 7,600 angstroms layer of JSR-KRF-MISG (DUV) photoresist were etched in a MERIE etch chamber using a hydrofluorocarbon and fluorocarbon plasma with and without the addition of ammonia ($NH_3$) to form contact openings through the oxide layer.

Figure 12A:
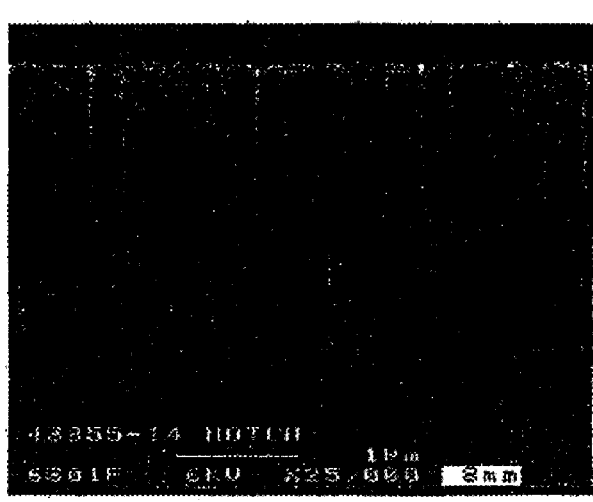
FIGS. 12a–b are, respectively, a cross-sectional view and a cross-sectional/oblique view of a scanning electromicrograph (SEM) of a layer of BPSG with overlying resist layer, that has been etched using a hydrofluorocarbon and fluorocarbon etchant gas.
Figure 12B:
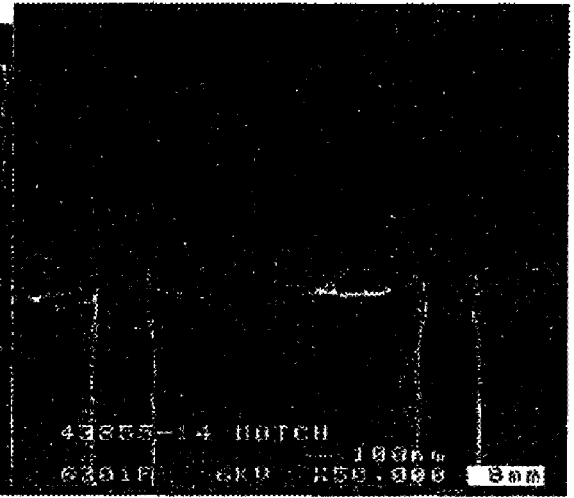

A first wafer (control wafer) was etched using a feed gas of 50 sccm $CHF_3$, 25 sccm $CF_4$, and 100 sccm Ar, at a pressure of 50 mTorr, power of 900 watts, ESC temperature of 10 C., and a time duration of 180 seconds. FIG. 12a shows a cross-sectional view of the resultant oxide layer with openings etched to a depth of about 7,100 angstroms. The thickness of the resist layer remaining after the etch was about 6,000 angstroms. FIG. 12b is a cross-sectional and oblique view of the surface of the etched oxide with overlying resist layer, showing the surface roughness of the resist. Such roughness has resulted in the development of striations at the top portion of a high aspect ratio etched contact opening.

Figure 12C:
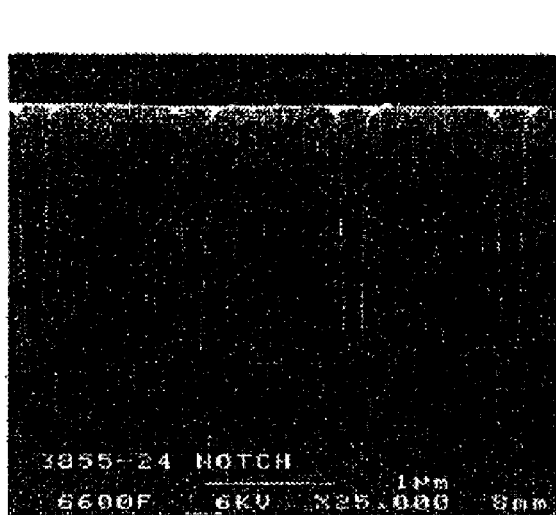
FIG. 12c–d are, respectively, a cross-sectional view and a cross-sectional/oblique view of SEM photomicrographs of a layer of BPSG with overlying resist layer, that has been etched using the same feed gas with the addition of $NH_3$.
Figure 12D:
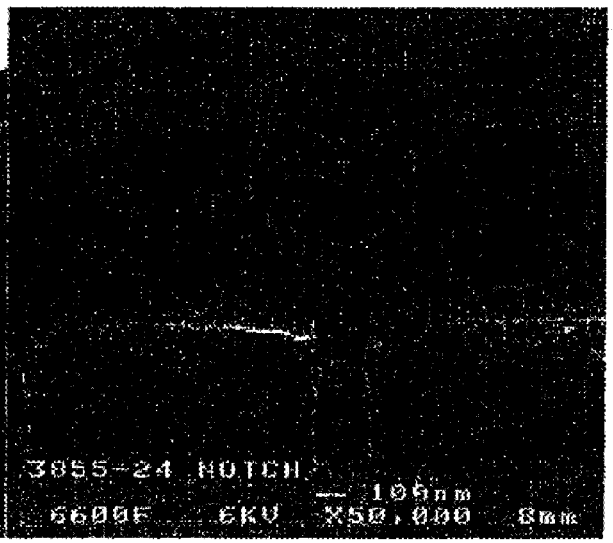

A second wafer (experimental) was etched using the same feed gas ($CHF_3$, $CF_4$, Ar) with the addition of 16 sccm $NH_3$ (pressure: 50 mTorr; power: 900 watts; ESC temperature: 10 C.; time duration: 180 seconds). FIG. 12c is a cross-sectional view of the resultant oxide layer with openings etched to a depth of about 11,000 angstroms. The thickness of the resist layer remaining after the etch was about 7,800 angstroms. FIG. 12d is a cross-sectional and oblique view of the etched oxide with overlying resist layer, showing the smoothness of the surface of the resist compared to the rough resist layer of the control wafer.

The contact opening that was etched in the BPSG layer using the etch gas with $NH_3$ was 4,000 angstroms deeper than the opening etched in the control wafer using the etch gas alone. In addition, the experimental wafer had approximately 2,000 angstroms more remaining resist compared to the control wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

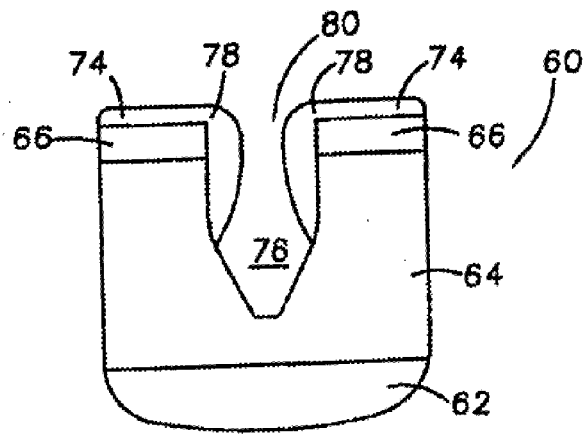

What is claimed is:

1. A method of forming an opening through a silicon oxide layer, comprising the steps of:
    providing a substrate having the silicon oxide layer situated thereon;
    first etching an opening into the silicon oxide layer through a mask opening using a first etch gas comprising at least one organic fluorocarbon and up to a minimal amount of a nitrogen-comprising gas such that formation of polymeric material is substantially suppressed during the first etching; and
    subsequent to the first etching, second etching to extend the opening into the silicon oxide layer through the mask opening while simultaneously depositing polymeric material onto the mask using a second etch gas comprising at least one organic fluorocarbon and a nitrogen-comprising gas in an amount effective to deposit the polymeric material on the mask while second etching to extend the opening and reduce erosion of the mask layer.

2. A method of forming an opening through a silicon oxide layer, comprising the steps of:
    providing a substrate having the silicon oxide layer situated thereon;
    first etching an opening into the silicon oxide layer through a mask opening using a first etch gas comprising at least one organic fluorocarbon and up to a minimal amount of a nitrogen-comprising gas whereby formation of polymeric material is substantially suppressed during the first etching; and
    subsequent to the first etching, second etching to extend the opening into the silicon oxide layer through the mask opening while simultaneously depositing polymeric material onto the mask using a second etch gas that includes at least one organic fluorocarbon and a nitrogen-comprising gas in an amount effective to reduce etching of the mask during the second etching.

3. A method of forming an opening having a high aspect ratio in a silicon oxide layer, comprising the steps of:
    providing a substrate having a silicon oxide layer situated thereon;
    forming a mask layer on the surface of the silicon oxide layer, the mask layer having at least one opening to expose an area of the underlying silicon oxide layer;
    exposing the substrate to a first etch gas to etch an opening in the silicon oxide layer to a depth without depositing a substantial amount of polymeric material during the etch, the first etch gas comprising at least one organic fluorocarbon and 0 to about 2% by volume of a nitrogen-comprising gas, based on the total volume of the first etch gas excluding inert gases, the opening having an aspect ratio of at least about 2:1;
    subsequent to the first etching, exposing the substrate to a second etch gas to further etch the opening in the silicon oxide layer to increase the depth of the opening while depositing a surface polymeric layer on the mask layer during the etch, the second etch gas comprising at least one organic fluorocarbon and a nitrogen-comprising gas in an amount greater than in the first etch gas up to about 40% by volume, based on the total volume of the second etch gas excluding inert gases.

4. A method of forming a contact opening having a high aspect ratio in a silicon dioxide layer, comprising the steps of:
    providing a substrate having a silicon dioxide layer situated thereon with a mask layer overlying the silicone dioxide layer, the mask layer having a thickness and at least one opening to expose the silicon dioxide layer;
    plasma etching the silicon dioxide layer with a first etch gas to etch an opening through the silicon dioxide layer without depositing a substantial amount of polymeric material during the etch, the opening having an aspect ratio of at least about 2:1; the first etch gas comprising at least one organic fluorocarbon and 0 to about 2% by volume of a nitrogen-comprising gas, based on the total volume of the first etch gas excluding inert gases; and
    subsequent to the first etching, plasma etching the silicon dioxide layer with a second etch gas to increase the aspect ratio of the opening and simultaneously deposit a surface polymeric layer on the photoresist layer during the etch sufficient to inhibit erosion of the photoresist layer during the plasma etching with the second etch gas; the second etch gas comprising at least one organic fluorocarbon and a nitrogen-comprising gas in an amount greater than the first etch gas up to about 40% by volume, based on the total volume of the second etch gas, excluding inert gases.

5. A method of forming a high aspect ratio opening in a silicon oxide layer, comprising the steps of:
providing a substrate having a silicon oxide layer situated thereon;
forming a mask layer on the surface of the silicon oxide layer, the mask layer having at least one opening to expose an area of the underlying silicon oxide layer;
exposing the substrate to a first etch gas to etch an opening in the silicon oxide layer without depositing a substantial amount of polymeric material during the etch, the first etch gas comprising at least one organic fluorocarbon having the formula $C_xH_yF_z$ wherein x is 1 to 6, y is 0 to 3, and z is 2x−y when cyclic or 2x−y+2 when noncyclic, and 0 to about 2% by volume of a nitrogen-comprising gas, the opening having an aspect ratio of at least about 2:1;
exposing the substrate to a second etch gas to further etch the opening in the silicon oxide layer and simultaneously deposit a polymeric layer on the mask layer during the second etch, the second etch gas comprising at least one organic fluorocarbon having the formula $C_xH_yF_z$ wherein x is 1 to 6, y is 0 to 3, and z is 2x−y when the fluorocarbon is cyclic or 2x−y+2 when the fluorocarbon is noncyclic, and about 3% to about 40% by volume of a nitrogen-comprising gas.

6. The method of claim 5, wherein the organic fluorocarbon is selected from the group consisting of $CF_4$, $CHF_3$, $CH_2F_2$, $C_2F_6$, and mixtures thereof.

7. A method for etching a layer of silicon oxide, comprising the steps of:
providing a substrate comprising a layer of silicon oxide and a mask layer overlying the silicon oxide layer, the mask layer having at least one opening to expose an area of the silicon oxide layer;
etching the layer of silicon oxide to provide an opening extending through the layer of silicon oxide to an aspect ratio of at least about 2:1 such that substantially no polymeric material is formed during the etching step, the opening having a depth; the etching being performed by exposing the layer of silicon oxide to a first etch gas in an ionized state in a reaction chamber of a plasma generating device, the first etch gas comprising at least one organic fluorocarbon and 0 to about 2% by volume of one or more nitrogen-comprising gases, based on the total volume of the first etch gas, excluding inert gases; and
subsequent to the first etching, etching the layer of silicon oxide to increase the depth of the opening through the silicon oxide layer while simultaneously forming polymeric material on the mask layer during the etch; the etching being performed by exposing the layer of silicon oxide to a second etch gas in an ionized state in a reaction chamber of a plasma generating device, the second etch gas comprising at least one organic fluorocarbon and at least one nitrogen-comprising gas in an amount effective to form the polymeric material on the mask layer during the etching step.

8. The method of claim 7, whereby the first etching forms an opening in the silicon oxide layer to a depth of at least about 0.5 micron.

9. The method of claim 7, wherein the second etch gas includes the nitrogen-comprising gas in an amount greater than in the first etch gas up to about 40% by volume, based on the total volume of the second etch gas, excluding inert gases.

10. The method of claim 7, wherein the first etch gas comprises 0 to about 2% by volume of the nitrogen-comprising gas, and the second etch gas comprises about 3% to about 20% by volume of the nitrogen-comprising gas.

11. The method of claim 7, wherein the organic fluorocarbon is a fluorinated hydrocarbon having the formula $C_xH_yF_z$ wherein x is 1 to 2, y is 0 to 3, and z is 2x−y+2.

12. The method of claim 7, wherein the organic fluorocarbon is selected from the group consisting of $CF_4$, $CHF_3$, $CH_2F_2$, $C_2F_6$, and mixtures thereof.

13. The method of claim 7, wherein the organic fluorocarbon is a fluorinated hydrocarbon having the formula $C_xH_yF_z$ wherein x is 3 to 6, y is 0 to 3, and z is 2x−y when the fluorinated hydrocarbon is cyclic, and z is 2x−y+2 when the fluorinated hydrocarbon is noncyclic.

14. The method of claim 7, wherein the organic fluorocarbon is a cyclic 3–6 carbon fluorocarbon selected from the group consisting of $C_3H_3F_3$, $CH_2F_4$, $C_3HF_5$, $C_3F_6$, $C_4H_3F_6$, $C_4H_2F_6$, $C_4HF_7$, $C_4F_6$, $C_4F_8$, $C_5H_3F_7$, $C_5H_2F_8$, $C_5HF_9$, $C_5F_10$, $C_6H_3F_9$, $C_6H_3F_9$, $C_6H_2F_{10}$, $C_4HF_{11}$, and $C_6F_{12}$, and mixtures thereof.

15. The method of claim 7, wherein the organic fluorocarbon is a noneyclic 3–6 carbon fluorocarbon selected from the group consisting of $C_3H_3F_5$, $C_3H_2F_6$, $C_3HF_7$, $C_3F_8$, $C_4H_3F_7$, $C_4H_2F_8$, $C_4HF_9$, $C_4F_{10}$, $C_5H_3F_9$, $C_5H_2F_{10}$, $C_5HF_{11}$, $C_5F_{12}$, $C_6H_3F_{11}$, $C_6H_2F_{12}$, $C_4HF_3$, and $C_6F_{14}$, and mixtures thereof.

16. The method of claim 7, wherein the nitrogen-comprising gas is selected from the group consisting of $N_2O$, $NH_3$, $N_2H_4$, R—$NH_2$ where R is a $C_1$–$C_3$ hydrocarbon or fluorocarbon, and mixtures thereof.

17. The method of claim 7, further comprising:
upon depositing on the mask layer a layer of the polymeric material that constricts the contact opening in the silicon oxide layer, exposing the layer of silicon oxide to the first etch gas to etch the layer of silicon oxide and increase the depth of the opening.

18. The method of claim 7, further comprising:
upon reducing the layer of polymeric material whereby the contact opening is unconstricted, exposing the layer of silicon oxide to the second etch gas to etch the layer of silicon oxide to increase the depth of the opening, and deposit polymeric material on the mask layer during the etching step.

19. The method of claim 7, wherein the etching step comprises reactive ion etching.

20. The method of claim 7, wherein the etching step comprises plasma etching.

21. A method for etching a layer of silicon oxide, comprising the steps of:
providing a substrate comprising a layer of silicon oxide and a mask layer overlying the silicon oxide layer, the mask layer having at least one opening to expose an area of the silicon oxide layer;
etching the layer of silicon oxide to provide an opening extending through the layer of silicon oxide to an aspect ratio of at least about 2:1, such that substantially no polymeric material is formed during the etching step, the opening having a depth; the etching being performed by exposing the layer of silicon oxide to a first etch gas in an ionized state in a reaction chamber of a plasma generating device, the first etch gas comprising at least one organic fluorocarbon and 0 to about 2% by volume of one or more nitrogen-comprising gases, based on the total volume of the first etch gas, excluding inert gases; and subsequent to the first etching, etching the layer of silicon oxide to increase the depth of the opening through the silicon oxide layer while simultaneously depositing polymeric material on the mask; the etching being performed by exposing the layer of silicon oxide to a second etch gas in an ionized state in a reaction chamber of a plasma generating device, the second etch gas comprising at least one organic fluorocarbon and at least one nitrogen-comprising gas in an amount effective to deposit the polymeric material to inhibit the erosion of the mask layer during the etching step.

22. A plasma etch method for selectively etching a silicon oxide on a silicon-comprising substrate, a mask layer overlying the silicon oxide layer; the method comprising the steps of:

maintaining an etch chamber containing the substrate at a pressure of about 20 mTorr to about 200 mTorr;

flowing into the etch chamber, a first etch gas comprising at least one organic fluorocarbon and 0 to about 2% by volume of a nitrogen-comprising gas, based on the total volume of the first etch gas, excluding inert gases;

maintaining a plasma associated with the first etch gas in the etch chamber within a power level of about 500 watts to about 3000 watts, to selectively etch an opening in the silicon oxide layer without etching the silicon-comprising layer and without substantially depositing polymeric material during the etch, the opening having an aspect ratio of at least about R=2;

flowing into the etch chamber, a second etch gas comprising at least one organic fluorocarbon and a nitrogen-comprising gas in an amount greater than in the first etch gas up to about 40% by volume; and maintaining a plasma associated with the second etch gas in the etch chamber within a power level of about 500 watts to about 3000 watts; to selectively etch the silicon oxide layer without etching the silicon-comprising layer to increase the depth of the opening and simultaneously deposit a surface polymeric layer on the mask layer sufficient to inhibit erosion of the mask layer during the etching with the plasma of the second etch gas.

23. The method of claim 22, wherein the method is carried out on a silicon dioxide layer in the etch chamber.

24. The method of claim 22, wherein the second etch gas comprises about 3% to about 20% by volume of the nitrogen-comprising gas.

25. The method of claim 22, wherein the pressure in the etch chamber is maintained at less than about 50 mTorr.

26. The method of claim 22, wherein the pressure in the etch chamber is maintained at about 50 mTorr to about 200 mTorr.

27. The method of claim 22, further comprises maintaining a plasma within the etch chamber within a power range of about 500 watts to about 3000 watts.

28. The method of claim 22, wherein the flow rate of the second etch gas is about 20 sccm to about 200 sccm for the fluorocarbon gas, and about 2 sccm to about 30 sccm for the nitrogen-comprising gas.

29. The method of claim 22, wherein the etching steps comprise reactive ion etching.

30. The method of claim 22, wherein the etching steps comprise plasma etching.

31. The method of claim 30, wherein the etching steps are performed using a TCP plasma reactor, a capacitively coupled plasma reactor, and a microwave source plasma reactor.

32. A method of forming an opening through a silicon oxide layer, comprising the steps of:

providing a substrate having the silicon oxide layer situated thereon;

first etching to form an opening in the silicon oxide layer through a mask opening while substantially suppressing formation of polymeric material using an etch gas comprising at least one organic fluorocarbon and up to a minimal amount of a nitrogen-comprising gas; and after the first etching, second etching into the silicon oxide layer through the mask opening to extend the opening while inhibiting erosion of the mask layer by increasing the amount of the nitrogen-comprising gas to simultaneously deposit polymeric material on the mask during the second etching.

33. The method of claim 32, wherein the etch gas of the first etching includes 0 to about 2% by volume of a nitrogen-comprising gas.

34. The method of claim 32, wherein the etch gas of the second etching includes 3% to about 40% by volume of the nitrogen-comprising gas.

35. The method of claim 32, whereby the first etching forms an opening in the silicon oxide layer to a depth of at least about 0.5 micron.

36. The method of claim 32, wherein the etching steps comprise reactive ion etching.

37. The method of claim 32, wherein the etching steps comprise plasma etching.

38. The method of claim 32, further comprising:

upon depositing on the mask layer a layer of the polymeric material that constricts the contact opening in the silicon oxide layer, exposing the layer of silicon oxide to the etch gas of the first etching to etch the layer of silicon oxide and increase the depth of the opening.

39. The method of claim 38, further comprising:

upon reducing the layer of polymeric material whereby the contact opening is unconstricted, exposing the layer of silicon oxide to the etch gas of the second etching to etch the layer of silicon oxide to increase the depth of the opening, and deposit polymeric material on the mask layer during the etching step.

40. A method for etching a layer of silicon oxide, comprising the steps of:

providing a substrate comprising a layer of silicon oxide and a mask layer overlying the silicon oxide layer, the mask layer having at least one opening to expose an area of the silicon oxide layer;

etching the layer of silicon oxide to provide an opening extending through the layer of silicon oxide to a depth of at least about 0.5 micron whereby substantially no polymeric material is formed during the etching step, the etching being performed by exposing the layer of silicon oxide to a first etch gas in an ionized state in a reaction chamber of a plasma generating device, the first etch gas comprising at least one organic fluorocarbon and 0 to about 2% by volume of one or more nitrogen-comprising gases, based on the total volume of the first etch gas; and further etching the layer of silicon oxide to increase the opening through the silicon oxide layer while simultaneously forming polymeric material on the mask layer; the etching being performed by exposing the layer of silicon oxide to a second etch gas in an ionized state in a reaction chamber of a plasma generating device, the second etch gas comprising at least one organic fluorocarbon and at least one nitrogen-comprising gas in an amount effective to provide formation of the polymeric material on the mask layer during said etching.

41. The method of claim 40, whereby the first etching forms an opening in the silicon oxide layer to a depth of at least about 1 micron.

42. The method of claim 40, wherein the second etch gas comprises the nitrogen-comprising gas in an amount greater than in the first etch gas up to about 40% by volume, based on the total volume of the second etch gas.

43. The method of claim 40, wherein the first etch gas comprises 0 to about 2% by volume of the nitrogen-comprising gas, and the second etch gas comprises about 3% to about 20% by volume of the nitrogen-comprising gas.

44. The method of claim 40, wherein the organic fluorocarbon is selected from the group consisting of $CF_4$, $CHF_3$, $CH_2F_2$, $C_2F_6$, and mixtures thereof.

45. The method of claim 40, wherein the organic fluorocarbon is a cyclic 3–6 carbon fluorocarbon selected from the group consisting of $C_3H_3F_3$, $CH_2F_4$, $C_3HF_5$, $C_3F_6$, $C_4H_3F_6$, $C_4H_2F_6$, $C_4HF_7$, $C_4F_6$, $C_4F_8$, $C_5H_3F_7$, $C_5H_2F_8$, $C_5HF_9$, $C_5F_{10}$, $C_6H_3F_9$, $C_6H_3F_9$, $C_6H_2F_{10}$, $C_4HF_{11}$, and $C_6F_{12}$, and mixtures thereof.

46. The method of claim 40, wherein the organic fluorocarbon is a noncyclic 3–6 carbon fluorocarbon selected from the group consisting of $C_3H_3F_5$, $C_3H_2F_6$, $C_3HF_7$, $C_3F_8$, $C_4H_3F_7$, $C_4H_2F_8$, $C_4HF_9$, $C_4F_{10}$, $C_5H_3F_9$, $C_5H_2F_{10}$, $C_5HF_{11}$, $C_5F_{12}$, $C_6H_3F_{11}$, $C_6H_2F_{12}$, $C_4HF_3$, and $C_6F_{14}$, and mixtures thereof.

47. The method of claim 40, wherein the nitrogen-comprising gas is selected from the group consisting of $N_2O$, $NH_3$, $N_2H_4$, $R-NH_2$ where $R=C_1-C_3$ hydrocarbon or fluorocarbon, and mixtures thereof.

48. The method of claim 40, wherein the etching step comprises reactive ion etching.

49. A method for etching a layer of silicon oxide, comprising the steps of:
providing a substrate comprising a layer of silicon oxide and a mask layer overlying the silicon oxide layer, the mask layer having at least one opening to expose an area of the silicon oxide layer;
etching the layer of silicon oxide to provide an opening extending through the layer of silicon oxide to a depth of at least about 0.5 micron such that substantially no polymeric material is formed during the etching step, the etching being performed by exposing the layer of silicon oxide to a first etch gas in an ionized state in a reaction chamber of a plasma generating device, the first etch gas comprising at least one organic fluorocarbon and 0 to about 2% by volume of one or more nitrogen-comprising gases, based on the total volume of the first etch gas; and
further etching the layer of silicon oxide to increase the opening through the silicon oxide layer while simultaneously depositing polymeric material to reduce etching of the mask; the etching being performed by exposing the layer of silicon oxide to a second etch gas in an ionized state in a reaction chamber of a plasma generating device, the second etch gas comprising at least one organic fluorocarbon and an effective amount of at least one nitrogen-comprising gas.

50. A method of forming an opening in a layer of oxide, comprising the steps of:
providing a substrate comprising a layer of oxide, an overlying layer of photoresist, and one or more openings in the photoresist exposing the oxide layer;
etching an opening in the oxide layer with a first etch gas such that substantially no polymer material deposits during the etching, the first etch gas comprising one or more fluorocarbons and up to a minimal amount of a nitrogen-comprising gas; and
further etching the oxide layer with a second etch gas to extend the opening in the oxide layer while simultaneously depositing polymer material on the photoresist layer, the second etch gas comprising one or more fluorocarbons and an amount of a nitrogen-comprising gas.

51. A method of etching an opening in an oxide layer disposed on a substrate and exposed through one or more openings in an overlying photoresist layer having a thickness, the method comprising the step of:
etching the opening in the oxide layer while controlling deposition of polymer material during the etching to maintain a thickness of the photoresist layer throughout the etching of the opening by etching the opening to a first depth using a first etch gas comprising one or more fluorocarbons and up to about 2% by volume nitrogen-comprising gas whereby substantially no polymer is deposited during said etching step, and etching the opening to a second depth using a second etch gas comprising one or more fluorocarbons and about 3% to about 40% by volume nitrogen-comprising gas whereby polymer is deposited during said etch to increase the thickness of the photoresist layer.

52. A method of etching an opening in an oxide layer disposed on a substrate and exposed through one or more openings in an overlying photoresist layer, the method comprising the steps of:
alternating etching of the oxide layer with a first etch gas and a second etch gas to extend the opening in the oxide layer while controlling deposition of polymer onto the photoresist layer;
the first etch gas comprising one or more fluorocarbons and up to about 2% by volume nitrogen comprising gas such that substantially no polymer deposits during etching with the first gas, and the second etch gas comprising one or more fluorocarbons and about 3% to about 40% by volume nitrogen-comprising gas such that polymer deposits onto the photoresist layer during etching with the second gas.

53. A method of forming an opening in a silicon oxide layer, comprising the steps of:
providing a substrate comprising an oxide layer exposed through one or more openings in an overlying photoresist layer;
first etching the opening in the oxide layer with an etch gas such formation of polymer material on the photoresist layer is substantially suppressed during the first etching, the etch gas comprising at least one fluorocarbon and optionally an amount of a nitrogen-comprising gas; and
second etching to extend the opening with an etch gas such that polymer material is deposited onto the photoresist layer during the second etching to increase thickness of the photoresist layer, the etch gas comprising at least one fluorocarbons and an amount of nitrogen-comprising gas.

54. A method of forming an opening in an oxide layer, the oxide layer exposed through one or more openings in an overlying photoresist layer, the photoresist layer having a thickness, the method comprising the steps of:

etching the opening in the oxide layer with a first etch gas comprising one or more fluorocarbons and up to about 2% by volume of a nitrogen gas whereby substantially no polymer material is deposited on the photoresist layer during the etching, with the first etch gas; and upon a reduction in the thickness of the photoresist layer, second etching to extend the opening in the oxide layer with a second etch gas comprising one or more fluorocarbons and about 3% to up to about 40% by volume of a nitrogen gas whereby polymer material is deposited on the photoresist layer during the etching with the second etch gas to maintain or increase the thickness of the photoresist layer.

55. A method of forming an opening in a layer of oxide exposed through one or more openings in an overlying photoresist layer, the method comprising the steps of:

etching the opening in the oxide layer with an etch gas comprising one or more fluorocarbons and up to about 2% by volume of a nitrogen-comprising gas whereby substantially no polymer is deposited during the etching, with the first etch gas;

etching the oxide layer to extend the opening by increasing the amount of the nitrogen-comprising gas in the etch gas whereby the etch rate of the photoresist layer is decreased; and optionally, etching the oxide layer to extend the opening by reducing the amount of the nitrogen-comprising gas in the etch gas whereby formation of polymer is substantially suppressed during said etching.

56. A method of forming an opening in a layer of oxide, comprising the steps of:

etching the opening in the oxide layer with a first etch gas comprising one or more fluorocarbons and up to about 2% by volume of a nitrogen-comprising gas whereby substantially no polymer is deposited, during the etching with the first etch gas;

etching the oxide layer to extend the opening with a second etch gas selective to the photoresist and comprising at least one fluorocarbon and an effective amount of at least one nitrogen-comprising gas whereby the etch rate of the photoresist is reduced, and polymer material is formed on the photoresist layer during etching with the second etch gas; and optionally, upon depositing a layer of polymer material onto the photoresist layer, etching the oxide layer with the first etch gas to extend the opening whereby substantially no polymer material is deposited during said etching with the first etch gas.

57. A method of forming an opening in an oxide layer disposed on a substrate and exposed through at least one opening in an overlying photoresist layer having a thickness, the method comprising the steps of:

forming the opening in the oxide layer by alternately etching the oxide layer with a first etch gas and a second etch gas, the first etch gas comprising at least one fluorocarbon and up to about 2% by volume of a nitrogen-comprising gas, whereby substantially no polymer is deposited during the etching with the first gas; and the second etch gas comprising at least one fluorocarbon and an amount of a nitrogen-comprising gas effective to decrease the etch rate of the photoresist layer whereby the thickness of the photoresist layer over the oxide layer outside the opening is maintained or increased during the etching of the opening with the second etch gas.

58. A method of forming an opening in an oxide layer disposed on a substrate and exposed through one or more openings in an overlying photoresist layer having a thickness, the method comprising the steps of:

forming the opening in the oxide layer by alternately etching the oxide layer with a first etch gas and with a second etch gas to maintain the photoresist layer at or about said thickness during the etching of the opening;

the first etch gas comprising one or more fluorocarbons and up to about 2% by volume of a nitrogen-comprising gas whereby substantially no polymer is deposited during etching with the first etch gas, and the second etch gas comprising an amount of the nitrogen-comprising gas to deposit polymer during etching with the second etch gas.

59. A method of forming an opening in an oxide layer disposed on a substrate and exposed through one or more openings of an overlying photoresist layer having a thickness, the method comprising the steps of:

partially forming the opening in the oxide layer with an etch gas comprising one or more fluorocarbons and up to about 2% by volume of a nitrogen-comprising gas whereby substantially no polymer is deposited during the etch;

extending the opening in the oxide layer by increasing the amount of the nitrogen-comprising gas in the etch gas to deposit polymer during the etch and maintain or increase the thickness of the photoresist layer; and optionally etching to extend the opening by decreasing the amount of the nitrogen-comprising gas in the etch gas whereby substantially no polymer is deposited during the etch.

60. A method of forming an opening in an oxide layer disposed on a substrate and exposed through one or more openings of an overlying photoresist layer having a thickness, the method comprising the steps of:

etching the opening in the oxide layer with an etch gas comprising one or more fluorocarbons and up to about 40% by volume of a nitrogen-comprising gas by alternately increasing and decreasing the amount of the nitrogen-comprising gas in the etch gas to extend the opening and maintain or increase the thickness of the photoresist layer wherein substantially no polymer is deposited during etching with the etch gas comprising up to 2% by volume of the nitrogen-comprising gas, and polymer is deposited during etching with the etch gas comprising about 3% to about 40% by volume of the nitrogen-comprising gas.

61. A method of forming an opening in an oxide layer disposed on a substrate and exposed through one or more openings of an overlying photoresist layer having a surface, the method comprising the steps of:

partially forming the opening in the oxide layer with an etch gas comprising one or more fluorocarbons and up to about 2% by volume of a nitrogen-comprising gas whereby substantially no polymer is deposited during the etch;

extending the opening in the oxide layer by increasing the amount of the nitrogen-comprising gas in the etch gas to deposit polymer during the etch and smooth the surface of the photoresist layer; and optionally etching to extend the opening by decreasing the amount of the nitrogen-comprising gas in the etch gas whereby substantially no polymer is deposited during the etch.

62. A method of forming an opening in an oxide layer disposed on a substrate and exposed through one or more openings of an overlying photoresist layer, the method comprising the steps of:

etching an opening in the oxide layer to a depth of at least about 0.5 micron using an etch gas comprising one or more fluorocarbons and up to about 2% by volume of a nitrogen-comprising gas whereby substantially no polymer is deposited during the etch;

continuing etching to extend the depth of the opening in the oxide layer by increasing the amount of the nitrogen-comprising gas in the etch gas whereby polymer is deposited during the etch onto the photoresist layer; and upon depositing a layer of polymer material to increase the photoresist layer to a desired thickness, continuing etching to extend the depth of the opening in the oxide layer by decreasing the amount of the nitrogen-comprising gas in the etch gas whereby substantially no polymer is deposited during the etch.

63. A method of forming an opening in an oxide layer disposed on a substrate and exposed through one or more openings of an overlying photoresist layer, the method comprising the steps of:

etching an opening in the oxide layer to a depth of at least about 0.5 micron, the opening having an aspect ratio of at least about 2:1, using an etch gas comprising one or more fluorocarbons and up to about 2% by volume of a nitrogen-comprising gas whereby substantially no polymer is deposited during the etch;

continuing etching to extend the depth of the opening in the oxide layer by increasing the amount of the nitrogen-comprising gas in the etch gas whereby polymer is deposited during the etch onto the photoresist layer; and upon depositing a layer of polymer material to increase the photoresist layer to a desired thickness, continuing etching to extend the depth of the opening in the oxide layer by decreasing the amount of the nitrogen-comprising gas in the etch gas whereby substantially no polymer is deposited during the etch.

* * * * *

UNITED STATES PATENT AND TRADEMARK OFFICE
CERTIFICATE OF CORRECTION

| | | |
|---|---|---|
| PATENT NO. | : 7,153,779 B2 | Page 1 of 6 |
| APPLICATION NO. | : 10/382019 | |
| DATED | : December 26, 2006 | |
| INVENTOR(S) | : Shane J. Trapp | |

It is certified that error appears in the above-identified patent and that said Letters Patent is hereby corrected as shown below:

The title page showing an illustrative figure(s) 1 should be deleted and substitute therefore the attached title page consisting of Fig. 9.

The drawing sheets 1-4 consisting of Fig(s) 1-12d should be deleted and substitute therefore the attached drawing sheets 1-4 consisting of Fig(s) 1-12d.

Column 12, line 26: Replace "noneyclic" with --noncyclic--.

Signed and Sealed this

Nineteenth Day of August, 2008

JON W. DUDAS
*Director of the United States Patent and Trademark Office*

United States Patent
Trapp

(10) Patent No.: US 7,153,779 B2
(45) Date of Patent: Dec. 26, 2006

(54) METHOD TO ELIMINATE STRIATIONS AND SURFACE ROUGHNESS CAUSED BY DRY ETCH

(75) Inventor: Shane J Trapp, Boise, ID (US)

(73) Assignee: Micron Technology, Inc., Boise, ID (US)

(*) Notice: Subject to any disclaimer, the term of this patent is extended or adjusted under 35 U.S.C. 154(b) by 268 days.

(21) Appl. No.: 10/382,019

(22) Filed: Mar. 5, 2003

(65) Prior Publication Data

US 2003/0162395 A1   Aug. 28, 2003

Related U.S. Application Data

(63) Continuation of application No. 09/652,835, filed on Aug. 31, 2000, now Pat. No. 6,569,774.

(51) Int. Cl.
H01L 21/302 (2006.01)
(52) U.S. Cl. .............. 438/706; 438/639; 438/714; 216/58
(58) Field of Classification Search .............. 438/706, 438/710, 712, 729, 637, 639, 640, 714; 216/57, 216/58, 67
See application file for complete search history.

(56) References Cited

U.S. PATENT DOCUMENTS

| | | | |
|---|---|---|---|
| 4,465,552 A | 8/1984 | Bobbio et al. | 156/643 |
| 4,615,764 A | 10/1986 | Bobbio et al. | 156/643 |
| 4,711,698 A | 12/1987 | Douglas | 156/643 |
| 4,734,157 A | 3/1988 | Carbaugh et al. | 156/643 |
| 5,176,790 A * | 1/1993 | Arleo et al. | 438/715 |
| 5,254,213 A | 10/1993 | Tamaki | 156/655 |
| 5,269,879 A | 12/1993 | Rhoades et al. | 156/643 |
| 5,468,339 A | 11/1995 | Gupta et al. | 216/67 |
| 5,468,342 A | 11/1995 | Nulty et al. | 156/643.1 |
| 5,562,801 A * | 10/1996 | Nulty | 438/695 |
| 5,637,189 A * | 6/1997 | Peeters et al. | 438/466 |
| 5,719,089 A * | 2/1998 | Cherng et al. | 438/637 |
| 5,783,495 A | 7/1998 | Li et al. | 438/738 |
| 5,877,032 A * | 3/1999 | Guinn et al. | 438/9 |
| 5,895,740 A * | 4/1999 | Chien et al. | 430/313 |
| 5,935,877 A * | 8/1999 | Autryve | 438/743 |
| 6,063,712 A | 5/2000 | Gilton et al. | 438/756 |
| 6,074,957 A | 6/2000 | Donohoe et al. | 438/723 |
| 6,204,193 B1 | 3/2001 | Iozaki | 438/723 |
| 6,217,786 B1 * | 4/2001 | Hills et al. | 216/79 |
| 6,617,253 B1 * | 9/2003 | Chu et al. | 438/702 |

* cited by examiner

*Primary Examiner*—Lan Vinh
(74) *Attorney, Agent, or Firm*—Whyte Hirschboeck Dudek SC

(57) ABSTRACT

A plasma etch process for forming a high aspect ratio contact opening through a silicon oxide layer is disclosed. The silicon oxide layer is plasma etched using etch gases that include at least one organic fluorocarbon gas. At least one etch gas is used that includes one or more nitrogen-comprising gases to deposit a surface polymeric material during the etching for maintaining a masking layer over the silicon oxide layer. The method of the invention achieves a complete and anisotropic etching of a contact opening having a high aspect ratio and the desired dimensions.

63 Claims, 4 Drawing Sheets